United States Patent
Li

(10) Patent No.: US 9,793,330 B2
(45) Date of Patent: Oct. 17, 2017

(54) SLIM-BEZEL FLEXIBLE DISPLAY DEVICE AND MANUFACTURING METHOD THEREOF

(71) Applicant: Shenzhen China Star Optoelectronics Technology Co., Ltd., Shenzhen (CN)

(72) Inventor: Wenhui Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/761,311

(22) PCT Filed: Jun. 18, 2015

(86) PCT No.: PCT/CN2015/081728
§ 371 (c)(1),
(2) Date: Jul. 16, 2015

(87) PCT Pub. No.: WO2016/179876
PCT Pub. Date: Nov. 17, 2016

(65) Prior Publication Data
US 2016/0336532 A1  Nov. 17, 2016

(30) Foreign Application Priority Data
May 12, 2015 (CN) .......................... 2015 1 0239874

(51) Int. Cl.
*H01L 27/32* (2006.01)
*H01L 25/16* (2006.01)
(Continued)

(52) U.S. Cl.
CPC ........ *H01L 27/3262* (2013.01); *H01L 25/167* (2013.01); *H01L 25/18* (2013.01);
(Continued)

(58) Field of Classification Search
CPC ................................................. H01L 2227/323
See application file for complete search history.

(56) References Cited

U.S. PATENT DOCUMENTS 5,822,030 A * 10/1998 Uchiyama ........... G02F 1/13452
349/149
6,690,032 B1 * 2/2004 Umetsu ................. G02F 1/1345
257/621
(Continued)

FOREIGN PATENT DOCUMENTS

CN        104133307 A       11/2014

*Primary Examiner* — Caridad Everhart
*Assistant Examiner* — Ankush Singal
(74) *Attorney, Agent, or Firm* — Leong C. Lei

(57) ABSTRACT

The present invention provides a slim-bezel flexible display device and a manufacturing method thereof. A through hole is formed in a first base plate of a lower substrate in an area adjacent to an edge thereof. A conductive connection body is mounted in the through hole. The conductive connection body is connected to a circuit layout layer and a flexible connection circuit that is connected to a drive circuit board so as to have the drive circuit board and the circuit layout layer connected. Compared to the prior art, the present invention provides an arrangement that makes it not necessary for the side of the lower substrate associated with the circuit layout layer to provide an additional connection zone for connection with the flexible connection circuit so that an effective display zone of a flexible display device can be enlarged and a bezel area can be reduced. Further, the flexible connection circuit is completely arranged at one side of the lower substrate so that the flexible connection circuit curving around an edge of the lower substrate required in the prior art can be prevented thereby eliminating the issue of a lateral side space of the lower substrate being undesirably occupied, allowing further reduction of the bezel area for achieving slim-bezel displaying.

4 Claims, 5 Drawing Sheets

(51) Int. Cl.
*H01L 25/18* (2006.01)
*H01L 27/12* (2006.01)
*H01L 51/00* (2006.01)

(52) U.S. Cl.
CPC ...... *H01L 27/3276* (2013.01); *H01L 27/1218* (2013.01); *H01L 27/1259* (2013.01); *H01L 51/003* (2013.01); *H01L 51/0097* (2013.01); *H01L 2251/5338* (2013.01)

(56) References Cited

U.S. PATENT DOCUMENTS

| | | | | |
|---|---|---|---|---|
| 8,643,803 B2* | 2/2014 | Miyazaki | ............ | G02F 1/13318 345/102 |
| 8,794,786 B2* | 8/2014 | Cho | ................. | G02F 1/133604 362/217.09 |
| 8,908,257 B2* | 12/2014 | Song | ........................ | G02F 1/167 359/254 |
| 9,195,084 B2* | 11/2015 | Yokawa | ............ | G02F 1/133308 |
| 9,298,028 B2* | 3/2016 | Kubo | ................... | G02B 6/0088 |
| 9,326,375 B2* | 4/2016 | Lee | ......................... | H05K 1/028 |
| 9,406,698 B2* | 8/2016 | Yamazaki | ........... | H01L 27/1214 |
| 2001/0033009 A1* | 10/2001 | Inoue | ................. | H05K 7/20963 257/668 |
| 2008/0303408 A1* | 12/2008 | Yamazaki | ............ | H01L 27/3244 313/498 |
| 2009/0057672 A1* | 3/2009 | Kobayashi | .............. | H01L 29/04 257/59 |
| 2009/0066589 A1* | 3/2009 | Yamazaki | ............ | G06K 19/04 343/702 |
| 2011/0204366 A1* | 8/2011 | Nakatani | ............ | H01L 27/3274 257/59 |
| 2012/0182700 A1* | 7/2012 | Byeon | ............... | G02F 1/133308 361/749 |
| 2012/0224117 A1* | 9/2012 | Miyazaki | ............ | G02F 1/13318 349/58 |
| 2012/0257151 A1* | 10/2012 | Teramoto | .......... | G02F 1/133512 349/106 |
| 2013/0016303 A1* | 1/2013 | Tokunaga | ......... | G02F 1/133308 349/58 |
| 2013/0050227 A1* | 2/2013 | Petersen | ................ | H01L 23/053 345/501 |
| 2014/0042406 A1* | 2/2014 | Degner | ................. | H01L 27/326 257/40 |
| 2014/0063364 A1* | 3/2014 | Hirakata | ............... | G06F 1/1692 349/12 |
| 2014/0065430 A1* | 3/2014 | Yamazaki | .......... | H01L 27/1214 428/426 |
| 2014/0334182 A1* | 11/2014 | Chen | .................... | G02B 6/0083 362/611 |
| 2015/0036300 A1* | 2/2015 | Park | ....................... | H05K 1/147 361/749 |
| 2015/0213767 A1* | 7/2015 | Takagi | ................ | F21V 23/0457 345/101 |
| 2015/0372065 A1* | 12/2015 | Yamazaki | ........... | H01L 27/3276 257/89 |
| 2016/0013442 A1* | 1/2016 | Akimoto | .............. | H01L 51/003 257/59 |
| 2016/0104441 A1* | 4/2016 | Lee | ...................... | G09G 3/3622 345/204 |
| 2016/0113106 A1* | 4/2016 | Kim | ....................... | H05K 1/028 361/749 |
| 2016/0164036 A1* | 6/2016 | Jung | ................... | H01L 51/5253 257/40 |
| 2016/0181345 A1* | 6/2016 | Lee | ..................... | H01L 27/3276 257/40 |
| 2016/0202523 A1* | 7/2016 | Xia | ........................ | G02F 1/13336 349/58 |
| 2016/0336532 A1* | 11/2016 | Li | ........................ | H01L 25/167 |
| 2016/0336540 A1* | 11/2016 | Li | ....................... | H01L 51/5253 |

* cited by examiner

SLIM-BEZEL FLEXIBLE DISPLAY DEVICE AND MANUFACTURING METHOD THEREOF

BACKGROUND OF THE INVENTION

1. Field of the Invention

The present invention relates to the field of displaying technology, and in particular to a slim-bezel flexible display device and a manufacturing method thereof.

2. The Related Arts

Nowadays, with the rapid growth of the demands in respect of portable mobile devices and wearable display products, flexible display devices have continuously attracting the attention of the industry and have become one of the hottest trends of the future development of the field of displaying technology. Various techniques are available for flexible displays, including the traditional liquid crystal display technology, bistable liquid crystal display technology, organic light-emitting diode (OLED) display technology, electrophoretic display technology, electrochromism (EC) display technology, and electroluminescent (EL) display technology.

Slim-bezel flexible display devices have various advantages, including enlarged effective displaying area and aesthetics, and are one of the hot spots of research and development of the industry.

A conventional flexible display device is illustrated in FIG. 1 and comprises an upper substrate 100, a lower substrate 200, sealing resin 300 sealing and connecting between the upper substrate 100 and the lower substrate 200, and a drive circuit board 400 that is electrically connected by a flexible connection circuit 410 to the lower substrate 200, wherein the lower substrate 200 comprises a first base plate 210 and a circuit layout layer 230 formed on the first base plate 210. The upper substrate 100 is arranged to face the surface of the lower substrate 200 on which the circuit layout layer 230 is formed. The drive circuit board 400 is arranged adjacent to the surface of the first base plate 210 that is distant from the circuit layout layer 230 and is electrically connected via the flexible connection circuit 410 to the circuit layout layer 230.

In the above-described flexible display device, in addition to the arrangement of an effective display zone, the side of the lower substrate 200 that is associated with the circuit layout layer 230 necessarily and additionally comprises a connection zone for connection with the flexible connection circuit 410. Since the connection zone does not provide effective displaying and takes a certain width, an area of a bezel of the flexible display device is increased. Further, since the flexible connection circuit 410 has an end that is connected with the circuit layout layer 210 formed on an upper surface of the lower substrate 200 and an opposite end that is connected to a drive circuit board 300 located on the side of the lower surface of the lower substrate 200, the flexible connection circuit 410 must be set around an edge of the lower substrate 200 and shows a U-shaped configuration. Since the flexible connection circuit 410 occupies a certain amount of space at the edge of the lower substrate 200, the bezel of the flexible display device is further expanded, making it hard to achieve slim-bezel displaying.

SUMMARY OF THE INVENTION

An object of the present invention is to provide a slim-bezel flexible display device, which has a narrower bezel and may improve displaying quality.

An object of the present invention is also to provide a manufacturing method of a flexible display device, in which a conductive connection body is arranged in a lower substrate and the conductive connection body is connected to a circuit layout layer and a flexible connection circuit that is connected to a drive circuit board so as to have the drive circuit board and the circuit layout layer connected, making it not necessary for the side of the lower substrate associated with the circuit layout layer to provide an additional connection zone for connection with the flexible connection circuit so that an effective display zone of a flexible display device can be enlarged to achieve a slim bezel and improve displaying quality.

To achieve the above objects, the present invention provides a slim-bezel flexible display device, which comprises an upper substrate, a lower substrate, enclosure resin sealing and connecting between the upper substrate and the lower substrate, and a drive circuit board electrically connected by a flexible connection circuit to the lower substrate;

the lower substrate comprising a first base plate, a conductive connection body arranged in the first base plate, and a circuit layout layer arranged on the first base plate;

the upper substrate being arranged to face a surface of the lower substrate on which the circuit layout layer is formed;

the first base plate comprising a through hole formed therein in an area adjacent to an edge thereof, the conductive connection body being received and mounted in the through hole, the circuit layout layer being set in contact engagement with and in electrical connection with an end of the conductive connection body, the drive circuit board and the flexible connection circuit being both arranged at one side of the first base plate that is distant from the circuit layout layer, the flexible connection circuit having two ends respectively connected to the drive circuit board and an end of the conductive connection body that is distant from the circuit layout layer so as to achieve electrical connection between the drive circuit board and the circuit layout layer.

The lower substrate further comprises a thin-film transistor arranged between the first base plate and the circuit layout layer and an organic light emitting diode arranged on the circuit layout layer.

The upper substrate has a size smaller than a size of the lower substrate and the lower substrate and the upper substrate are laminated together in such a way that the conductive connection body is located in an area of the lower substrate that does not overlap the upper substrate.

The first base plate is a flexible substrate.

The conductive connection body comprises a material of metal and the enclosure resin is an ultraviolet curable resin.

The present invention also provides a manufacturing method of a slim-bezel flexible display device, which comprises the following steps:

(1) providing a glass substrate and forming a first base plate on the glass substrate;

(2) forming a through hole in an area of the first base plate that is adjacent to an edge;

(3) forming a conductive connection body in the through hole;

(4) forming a circuit layout layer on the first base plate and the conductive connection body in such a way that the circuit layout layer is in contact engagement with and is electrically connected to an end of the conductive connection body so as to form a lower substrate, wherein the lower substrate comprises the first base plate, the conductive connection body arranged in the first base plate, and the circuit layout layer arranged on the first base plate;

(5) providing an upper substrate, the upper substrate being arranged to face and laminated to a surface of the lower substrate on which the circuit layout layer is formed and applying enclosure resin for sealing and connection therebetween;

(6) removing the glass substrate from the first base plate to expose a side of the first base plate that is distant from the circuit layout layer and an end of the conductive connection body that is distant from the circuit layout layer; and (7) providing a drive circuit board and a flexible connection circuit, arranging both the drive circuit board and the flexible connection circuit close to one side of the first base plate that is distant from the circuit layout layer, connecting two ends of the flexible connection circuit respectively to the drive circuit board and the end of the conductive connection body that is distant from the circuit layout layer, whereby since the conductive connection body is electrically connected to the circuit layout layer, electrical connection between the drive circuit board and the circuit layout layer is achieved.

In step (3), a process of manufacturing the conductive connection body comprises: using physical vapor deposition to form a conductive film on the first base plate and subjecting the conductive film to patternization through a photolithographic process to preserve a portion thereof that corresponds to the through hole thereby forming a conductive connection body in the through hole.

In step (4), before the formation of the circuit layout layer, a thin-film transistor is formed on the first base plate and after the formation of the circuit layout layer, an organic light emitting diode is formed on the circuit layout layer so that the lower substrate so formed further comprises the thin-film transistor between the first base plate and the circuit layout layer and the organic light emitting diode on the circuit layout layer.

The upper substrate has a size smaller than a size of the lower substrate and after the lower substrate and the upper substrate are laminated together, the conductive connection body is located in an area of the lower substrate that does not overlap and the upper substrate.

The first base plate is a flexible substrate and the first base plate is formed through coating; and the conductive connection body comprises a material of metal and the enclosure resin is ultraviolet curable resin.

The present invention further provides a manufacturing method of a slim-bezel flexible display device, which comprises the following steps:

(1) providing a glass substrate and forming a first base plate on the glass substrate;

(2) forming a through hole in an area of the first base plate that is adjacent to an edge;

(3) forming a conductive connection body in the through hole;

(4) forming a circuit layout layer on the first base plate and the conductive connection body in such a way that the circuit layout layer is in contact engagement with and is electrically connected to an end of the conductive connection body so as to form a lower substrate, wherein the lower substrate comprises the first base plate, the conductive connection body arranged in the first base plate, and the circuit layout layer arranged on the first base plate;

(5) providing an upper substrate, the upper substrate being arranged to face and laminated to a surface of the lower substrate on which the circuit layout layer is formed and applying enclosure resin for sealing and connection therebetween;

(6) removing the glass substrate from the first base plate to expose a side of the first base plate that is distant from the circuit layout layer and an end of the conductive connection body that is distant from the circuit layout layer;

(7) providing a drive circuit board and a flexible connection circuit, arranging both the drive circuit board and the flexible connection circuit close to one side of the first base plate that is distant from the circuit layout layer, connecting two ends of the flexible connection circuit respectively to the drive circuit board and the end of the conductive connection body that is distant from the circuit layout layer, whereby since the conductive connection body is electrically connected to the circuit layout layer, electrical connection between the drive circuit board and the circuit layout layer is achieved;

wherein in step (3), a process of manufacturing the conductive connection body comprises: using physical vapor deposition to form a conductive film on the first base plate and subjecting the conductive film to patternization through a photolithographic process to preserve a portion thereof that corresponds to the through hole thereby forming a conductive connection body in the through hole;

wherein in step (4), before the formation of the circuit layout layer, a thin-film transistor is formed on the first base plate and after the formation of the circuit layout layer, an organic light emitting diode is formed on the circuit layout layer so that the lower substrate so formed further comprises the thin-film transistor between the first base plate and the circuit layout layer and the organic light emitting diode on the circuit layout layer;

wherein the upper substrate has a size smaller than a size of the lower substrate and after the lower substrate and the upper substrate are laminated together, the conductive connection body is located in an area of the lower substrate that does not overlap and the upper substrate; and wherein the first base plate is a flexible substrate and the first base plate is formed through coating; and the conductive connection body comprises a material of metal and the enclosure resin is ultraviolet curable resin.

The efficacy of the present invention is that the present invention provides a slim-bezel flexible display device and a manufacturing method thereof, in which a through hole is formed in an area of a first base plate of a lower substrate adjacent to an edge and a conductive connection body is mounted in the through hole, wherein the conductive connection body is connected to a circuit layout layer and a flexible connection circuit connected to a drive circuit board so as to have the drive circuit board and the circuit layout layer connected to each other. Compared to the prior art, the present invention provides an arrangement that makes it not necessary for the side of the lower substrate associated with the circuit layout layer to provide an additional connection zone for connection with the flexible connection circuit so that an effective display zone of a flexible display device can be enlarged and a bezel area can be reduced. Further, the flexible connection circuit is completely arranged at one side of the lower substrate so that the flexible connection circuit curving around an edge of the lower substrate required in the prior art can be prevented thereby eliminating the issue of a lateral side space of the lower substrate being undesirably occupied, allowing further reduction of the bezel area for achieving slim-bezel displaying.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 2:
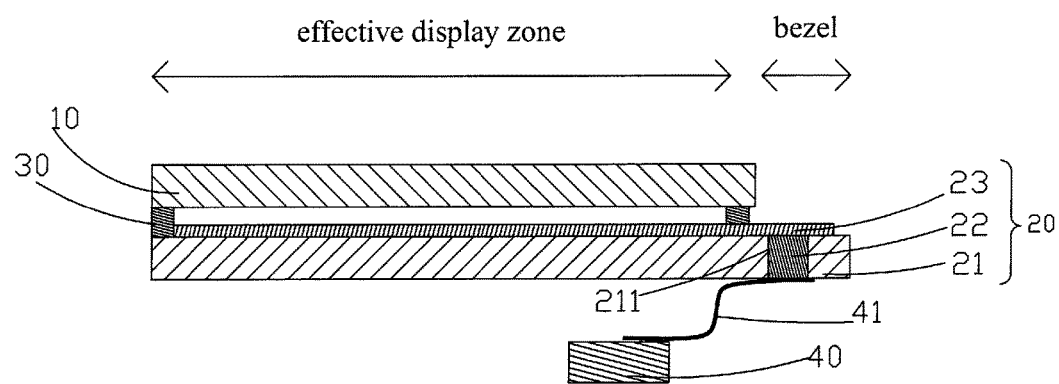
FIG. 2 is a schematic view showing a slim-bezel flexible display device according to the present invention.

Referring to FIG. 2, the present invention provides a slim-bezel flexible display device, which comprises an upper substrate 10, a lower substrate 20, enclosure resin 30 sealing and connecting between the upper substrate 10 and the lower substrate 20, and a drive circuit board 40 that is electrically connected by a flexible connection circuit 41 to the lower substrate 20.

Specifically, the lower substrate 20 comprises a first base plate 21, a conductive connection body 22 arranged in the first base plate 21, and a circuit layout layer 23 arranged on the first base plate 21.

Specifically, the upper substrate 10 is arranged to face the surface of the lower substrate 20 on which the circuit layout layer 23 is formed.

Specifically, the first base plate 21 comprises a through hole 211 formed therein in an area adjacent to an edge thereof. The conductive connection body 22 is received and mounted in the through hole 211. The circuit layout layer 23 is set in contact engagement with and in electrical connection with an end of the conductive connection body 22. The drive circuit board 40 and the flexible connection circuit 41 are both arranged at one side of the first base plate 21 that is distant from the circuit layout layer 23. The flexible connection circuit 41 has two ends respectively connected to the drive circuit board 40 and an end of the conductive connection body 22 that is distant from the circuit layout layer 23 so as to achieve electrical connection between the drive circuit board 40 and the circuit layout layer 23.

Specifically, the lower substrate 20 comprises additional devices/components (not shown), including a thin-film transistor (TFT) arranged between the first base plate 21 and the circuit layout layer 23 and an organic light emitting diode (OLED) arranged on the circuit layout layer 23.

Specifically, the upper substrate 10 has a size smaller than a size of the lower substrate 20 and after the lower substrate 20 and the upper substrate 10 are laminated together, the conductive connection body 22 is located in an area of the lower substrate 20 that does not overlap the upper substrate 10.

Preferably, the first base plate 21 is a flexible substrate.

Specifically, the upper substrate 10 comprises a second base plate. Preferably, the second base plate is a flexible substrate. Specifically, the upper substrate 10 is a package lid and is hermetically connected to the lower substrate 20 by the enclosure resin 30 so as to achieve packaging of the lower substrate 20.

Specifically, the conductive connection body 22 comprises a material of metal, such as molybdenum, aluminum, copper, and silver.

Preferably, the enclosure resin 30 is an ultraviolet (UV) curable resin.

Figure 1:
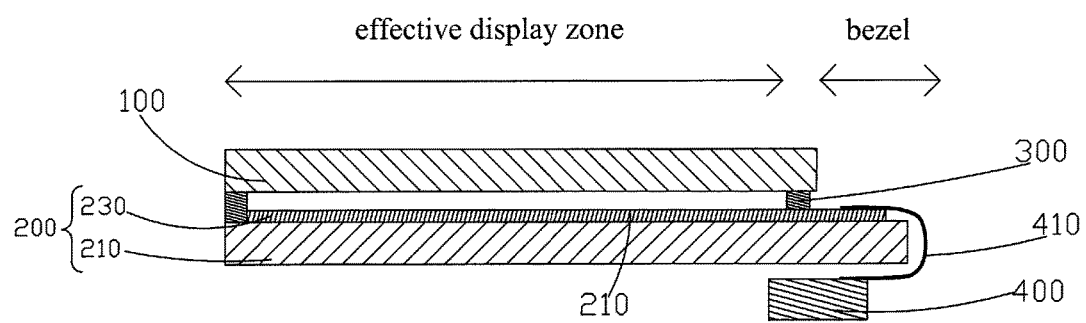
FIG. 1 is a schematic view showing the structure of a conventional flexible display device.

The present invention provides a slim-bezel flexible display device, which comprises a lower substrate 20 that comprises a first base plate 21 comprising a through hole 211 formed therein in an area adjacent to an edge and a conductive connection body 22 received and retained in the through hole 211, wherein the conductive connection body 22 is connectable to a circuit layout layer 23 and a flexible connection circuit 41 that is connected to a drive circuit board 40 so as to connect the drive circuit board 40 and the circuit layout layer 23 to each other. Compared to the prior art, the present invention provides an arrangement that makes it not necessary for the side of the lower substrate 20 associated with the circuit layout layer 23 to provide an additional connection zone for connection with the flexible connection circuit 41 so that an effective display zone of a flexible display device can be enlarged and a bezel area can be reduced. Further, the flexible connection circuit 41 is completely arranged at one side of the lower substrate 20 so that the flexible connection circuit 410 curving around an edge of the lower substrate 200 required in the prior art can be prevented thereby eliminating the issue of a lateral side space of the lower substrate 200 being undesirably occupied (see FIG. 1), allowing further reduction of the bezel area for achieving slim-bezel displaying.

Figure 3:
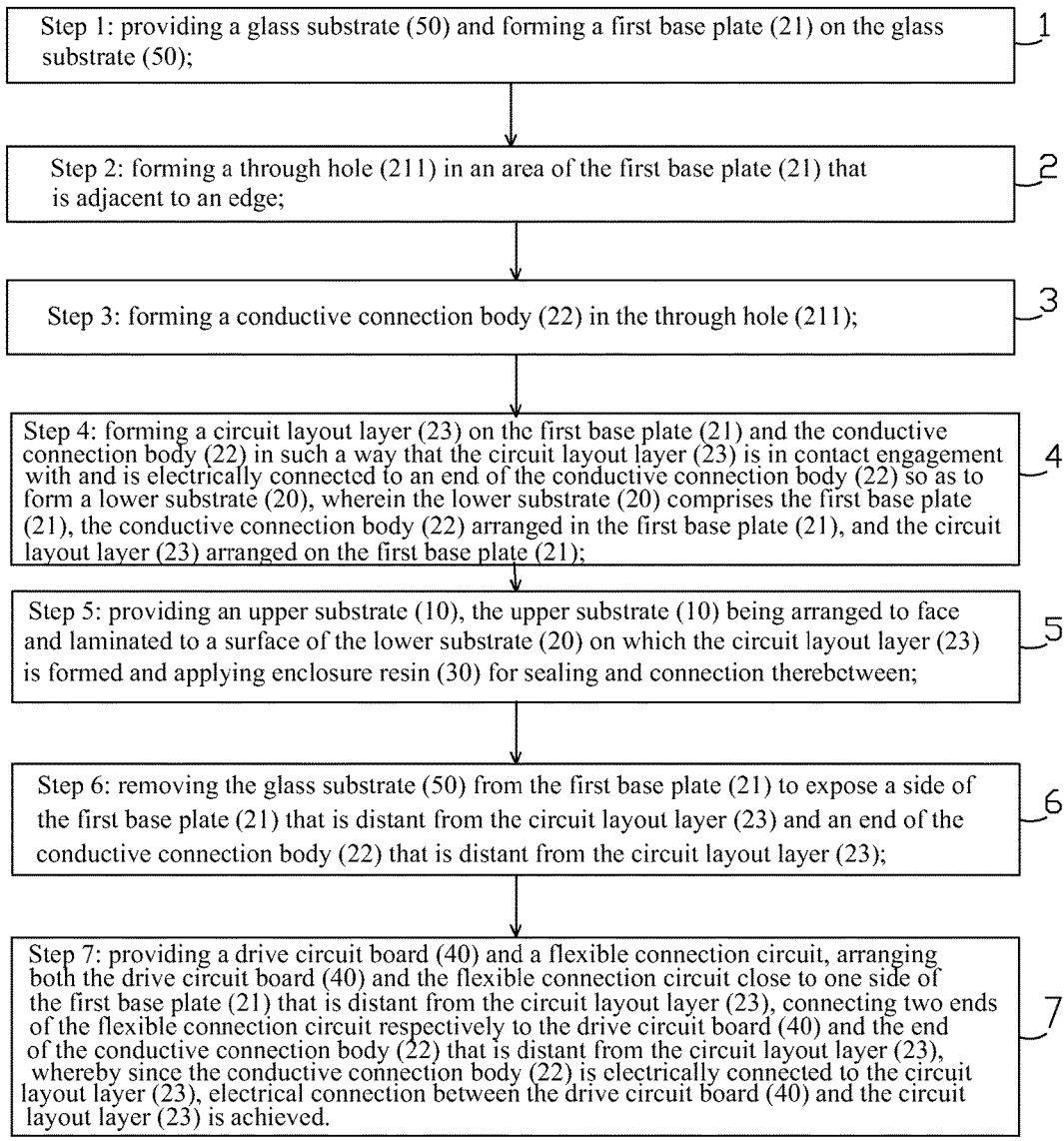
FIG. 3 is a flow chart illustrating a manufacturing method of a slim-bezel flexible display device according to the present invention.
Figure 4:
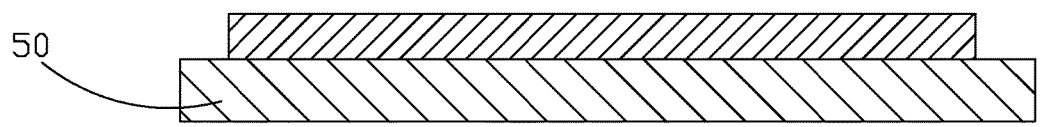
FIG. 4 is a schematic view illustrating a first step of the manufacturing method of the slim-bezel flexible display device according to the present invention.

Referring to FIG. 3, the present invention also provides a manufacturing method of a slim-bezel flexible display device, which comprises the following steps:

Step 1: as shown in FIG. 4, providing a glass substrate 50 and forming a first base plate 21 on the glass substrate 50.

Specifically, the first base plate 21 is a flexible substrate. Preferably, the first base plate 21 is formed through coating.

Figure 5:
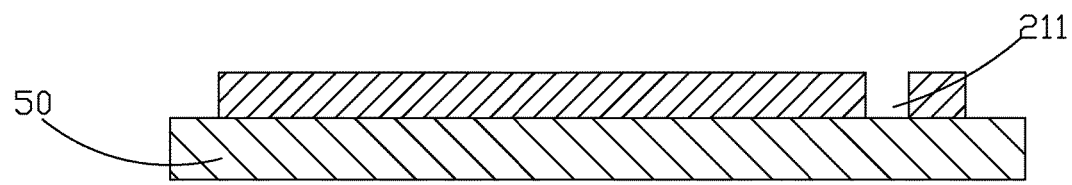
FIG. 5 is a schematic view illustrating a second step of the manufacturing method of the slim-bezel flexible display device according to the present invention.

Step 2: as shown in FIG. 5, forming a through hole 211 in an area of the first base plate 21 that is adjacent to an edge.

Specifically, the through hole 211 is formed through a photolithographic process.

Figure 6:
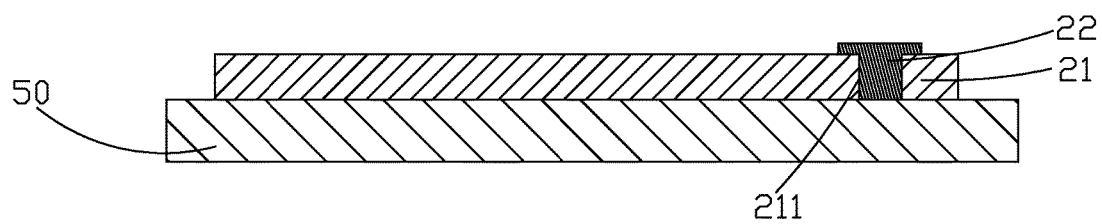
FIG. 6 is a schematic view illustrating a third step of the manufacturing method of the slim-bezel flexible display device according to the present invention.

Step 3: as shown in FIG. 6, forming a conductive connection body 22 in the through hole 211.

Specifically, a process of manufacturing the conductive connection body 22 is as follows: Physical vapor deposition (PVD) is used to form a conductive film on the first base plate 21 and the conductive film is subjected to patternization through a photolithographic process to preserve a portion thereof that corresponds to the through hole 211 thereby forming a conductive connection body 22 in the through hole 211.

Specifically, the photolithographic process comprises operations of coating photoresist, exposure, development, wet etching, and removal of photoresist.

Preferably, the conductive connection body 22 comprises a material of metal, such as molybdenum, aluminum, copper, and silver.

Figure 7:
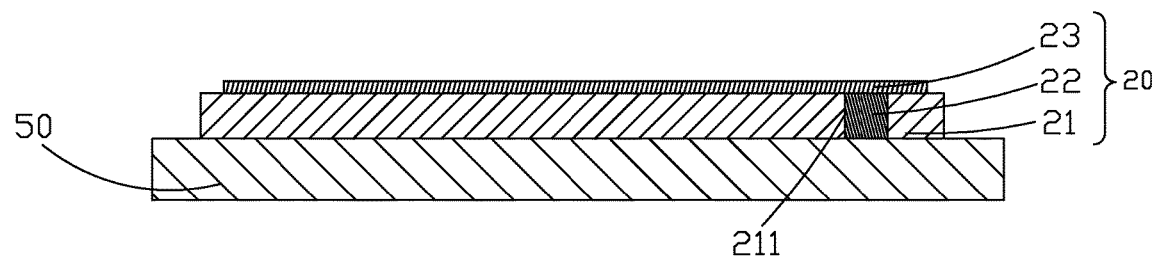
FIG. 7 is a schematic view illustrating a fourth step of the manufacturing method of the slim-bezel flexible display device according to the present invention.

Step 4: as shown in FIG. 7, forming a circuit layout layer 23 on the first base plate 21 and the conductive connection body 22 in such a way that the circuit layout layer 23 is in contact engagement with and is electrically connected to an end of the conductive connection body 22 so as to form a lower substrate 20, wherein the lower substrate 20 comprises the first base plate 21, the conductive connection body 22 arranged in the first base plate 21, and the circuit layout layer 23 arranged on the first base plate 21.

Specifically, before the formation of the circuit layout layer 23, devices/components (not shown), including a thin-film transistor (TFT), can be formed on the first base plate 21 and after the formation of the circuit layout layer 23, device/components (not shown), including an organic light emitting diode (OLED), can be formed on the circuit layout layer 23. Thus, the lower substrate 20 so formed may further comprises additional devices/components, such as a TFT arranged between the first base plate 21 and the circuit layout layer 23 and an OLED arranged on the circuit layout layer 23.

Figure 8:
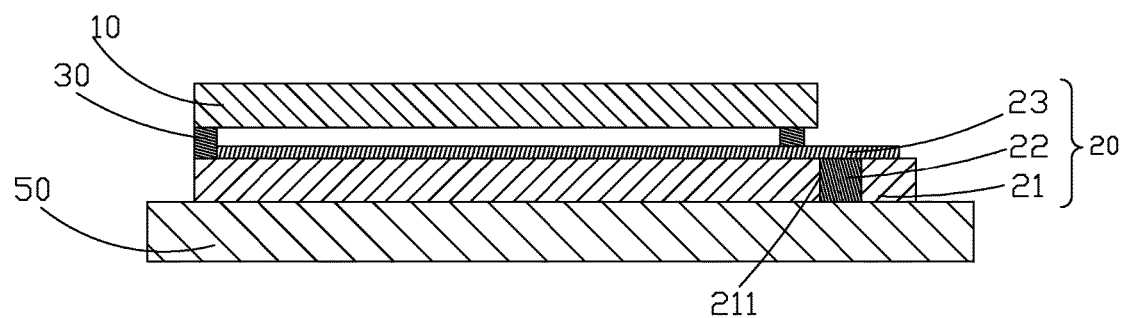
FIG. 8 is a schematic view illustrating a fifth step of the manufacturing method of the slim-bezel flexible display device according to the present invention.

Step 5: as shown in FIG. 8, providing an upper substrate 10, the upper substrate 10 being arranged to face and laminated to a surface of the lower substrate 20 on which the circuit layout layer 23 is formed and applying enclosure resin 30 for sealing and connection therebetween.

Specifically, the upper substrate 10 is a package lid and is hermetically connected to the lower substrate 20 by the enclosure resin 30 so as to achieve packaging of the lower substrate 20.

Specifically, the upper substrate 10 comprises a second base plate. Preferably, the second base plate is a flexible substrate.

The upper substrate 10 has a size smaller than a size of the lower substrate 20 and after the lower substrate 20 and the upper substrate 10 are laminated together, the conductive connection body 22 is located in an area of the lower substrate 20 that does not overlap the upper substrate 10.

Preferably, the enclosure resin 30 is an ultraviolet (UV) curable resin.

Figure 9:
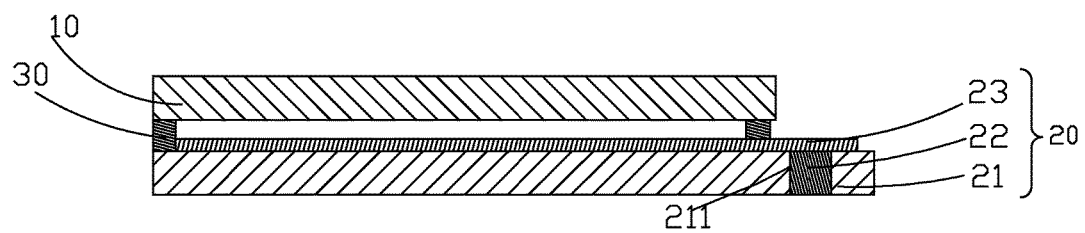
FIG. 9 is a schematic view illustrating a sixth step of the manufacturing method of the slim-bezel flexible display device according to the present invention.

Step 6: as shown in FIG. 9, removing the glass substrate 20 from the first base plate 21 to expose a side of the first base plate 21 that is distant from the circuit layout layer 23 and an end of the conductive connection body 22 that is distant from the circuit layout layer 23.

Step 7: providing a drive circuit board 40 and a flexible connection circuit 41, arranging both the drive circuit board 40 and the flexible connection circuit 41 close to one side of the first base plate 21 that is distant from the circuit layout layer 23, connecting two ends of the flexible connection circuit 41 respectively to the drive circuit board 40 and the end of the conductive connection body 22 that is distant from the circuit layout layer 23, whereby since the conductive connection body 22 is electrically connected to the circuit layout layer 23, electrical connection between the drive circuit board 40 and the circuit layout layer 23 is achieved, and a flexible display device as shown in FIG. 2 is formed.

The present invention provides a manufacturing method of a slim-bezel flexible display device, in which a through hole 211 is formed in an area of a first base plate 21 of a lower substrate 20 adjacent to an edge and a conductive connection body 22 is mounted in the through hole 211, wherein the conductive connection body 22 is connected to a circuit layout layer 23 and a flexible connection circuit 41 connected to a drive circuit board 40, so as to have the drive circuit board 40 and the circuit layout layer 23 connected to each other. Compared to the prior art, the present invention provides an arrangement that makes it not necessary for the side of the lower substrate 20 associated with the circuit layout layer 23 to provide an additional connection zone for connection with the flexible connection circuit 41 so that an effective display zone of a flexible display device can be enlarged and a bezel area can be reduced. Further, the flexible connection circuit 41 is completely arranged at one side of the lower substrate 20 so that the flexible connection circuit 410 curving around an edge of the lower substrate 200 required in the prior art can be prevented thereby eliminating the issue of a lateral side space of the lower substrate 200 being undesirably occupied (see FIG. 1), allowing further reduction of the bezel area for achieving slim-bezel displaying.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A slim-bezel flexible display device, comprising:
an upper substrate, a lower substrate, enclosure resin sealing and connecting between the upper substrate and the lower substrate, and a drive circuit board electrically connected by a flexible connection circuit to the lower substrate;
the lower substrate comprising a first base plate, a conductive connection body arranged in the first base plate, and a circuit layout layer arranged on the first base plate;
the upper substrate being arranged to face a surface of the lower substrate on which the circuit layout layer is formed;
the first base plate comprising a through hole formed therein in an area adjacent to an edge thereof, the conductive connection body being received and mounted in the through hole, the circuit layout layer being set in contact engagement with and in electrical connection with an end of the conductive connection body, the drive circuit board and the flexible connection circuit being both arranged at one side of the first base plate that is distant from the circuit layout layer, the flexible connection circuit having two ends respectively connected to the drive circuit board and an end of the conductive connection body that is distant from the circuit layout layer so as to achieve electrical connection between the drive circuit board and the circuit layout layer;
wherein the first base plate comprises a flexible substrate having top and bottom surfaces opposite to each other, the through hole being formed in the flexible substrate between the top and bottom surfaces and forming an opening in each of the top and bottom surfaces, such that the conductive connection body is received in the through hole with the ends of the conductive connection body exposed through the openings in the top and bottom surfaces of the flexible substrate to be respectively connected to the circuit layout layer and the flexible connection circuit.

2. The slim-bezel flexible display device as claimed in claim 1, wherein the lower substrate further comprises a thin-film transistor arranged between the first base plate and the circuit layout layer and an organic light emitting diode arranged on the circuit layout layer.

3. The slim-bezel flexible display device as claimed in claim 1, wherein the upper substrate has a size smaller than a size of the lower substrate and the lower substrate and the upper substrate are laminated together in such a way that the conductive connection body is located in an area of the lower substrate that does not overlap the upper substrate.

4. The slim-bezel flexible display device as claimed in claim 1, wherein the conductive connection body comprises a material of metal and the enclosure resin is an ultraviolet curable resin.

* * * * *